United States Patent
De Sanctis et al.

(10) Patent No.: US 9,778,305 B2
(45) Date of Patent: Oct. 3, 2017

(54) PULSE WIDTH MEASUREMENT METHOD AND APPARATUS

(71) Applicant: Schrader Electronics Limited, Antrim (GB)

(72) Inventors: Giovanni De Sanctis, Antrim (GB); William David Stewart, Antrim (GB); Stephen John Robb, Antrim (GB)

(73) Assignee: Schrader Electronics Limited, Antrim (GB)

( * ) Notice: Subject to any disclaimer, the term of this patent is extended or adjusted under 35 U.S.C. 154(b) by 54 days.

(21) Appl. No.: 14/765,125

(22) PCT Filed: Jan. 30, 2014

(86) PCT No.: PCT/EP2014/051839
§ 371 (c)(1),
(2) Date: Jul. 31, 2015

(87) PCT Pub. No.: WO2014/122064
PCT Pub. Date: Aug. 14, 2014

(65) Prior Publication Data
US 2015/0362542 A1    Dec. 17, 2015

(30) Foreign Application Priority Data
Feb. 5, 2013    (GB) .................. 1302046.6

(51) Int. Cl.
*G01R 29/02* (2006.01)
*B60C 23/04* (2006.01)
*B60C 23/06* (2006.01)

(52) U.S. Cl.
CPC ........ *G01R 29/023* (2013.01); *B60C 23/0488* (2013.01); *B60C 23/064* (2013.01); *B60C 23/065* (2013.01)

(58) Field of Classification Search
CPC . G01R 29/023; B60C 23/0488; B60C 23/064; B60C 23/065
See application file for complete search history.

(56) References Cited

U.S. PATENT DOCUMENTS

| 4,511,460 A | 4/1985 | Baumert et al. |
| 6,591,668 B1 * | 7/2003 | Becherer ................ B60C 23/06 73/146 |

(Continued)

FOREIGN PATENT DOCUMENTS

JP    9196789 A    7/1997

OTHER PUBLICATIONS

Hernandez, S. E., et al., "Endless Pulse Repetition: New Method to Measure Cable Lengths, Distances and Positioning," Sensor Device Technologies and Applications (Sensordevices), 2010 First International Conference on, IEEE, Piscataway, NJ, USA, Jul. 18, 2010 (Jul. 18, 2010), pp. 16-20, XP031798496, ISB: 978-1-4244-7474-5.

(Continued)

*Primary Examiner* — Courtney Heinle
(74) *Attorney, Agent, or Firm* — Holland & Hart LLP

(57) ABSTRACT

A tire monitoring apparatus comprising a monitor installed on a tire and a pulse width measuring apparatus for measuring the width of pulses produced by the monitor. The pulse width measuring apparatus comprises a frequency analyzer for producing a frequency representation of the pulse, a signal processor for determining a minimum value of the frequency representation, and a pulse width estimator that inverts the minimum value to produce a measurement for the pulse width. The tire monitoring apparatus uses the pulse width measurement as an indication of characteristics of the tire.

34 Claims, 8 Drawing Sheets

(56) References Cited

U.S. PATENT DOCUMENTS

| | | | | |
|---|---|---|---|---|
| 2004/0100100 A1* | 5/2004 | Wilson | ............... | B60C 23/041 |
| | | | | 290/1 R |
| 2005/0081613 A1* | 4/2005 | Hattori | ................. | B60C 11/00 |
| | | | | 73/146 |
| 2010/0324858 A1* | 12/2010 | Pannek | ............... | B60C 23/064 |
| | | | | 702/141 |
| 2013/0263655 A1* | 10/2013 | Tebano | ................ | B60C 23/06 |
| | | | | 73/146.3 |
| 2016/0016444 A1* | 1/2016 | Lammers | .......... | B60C 23/0416 |
| | | | | 701/29.6 |

OTHER PUBLICATIONS

Garnacho, F. et al., "Evaluation Procedures for Lightning Impulse Parameters in Case of Waveforms with Oscillations and/or an Overshoot," IEEE Transactions on Power Delivery, IEEE Service Center, New York, NY, US, vol. 12, No. 2, Apr. 1, 1997 (1197-04-01), pp. 640-649, XP001241639, ISSN: 0885-8977, DOI: 10.1109/61.584333.

TEKTRONIX: "advanced Radar Analysis: Tools for Measureing Modern Radar," Internet Citation, Jan. 26, 2009 (Jan. 26, 2009), pp. 1-28, XP007915790, retrieved from the Internet: URL:http://ww2.tek.com/cmsreplieve/tirep/15006/37W__23378)0__LR_Letter__2010__01.08.16.1  2.29__15006_EN.pdf,  http://www2.tek.com/cmswpt/tidetails.lotr?ct=TI&cs=apn&ci=15006&1c=EN.

* cited by examiner

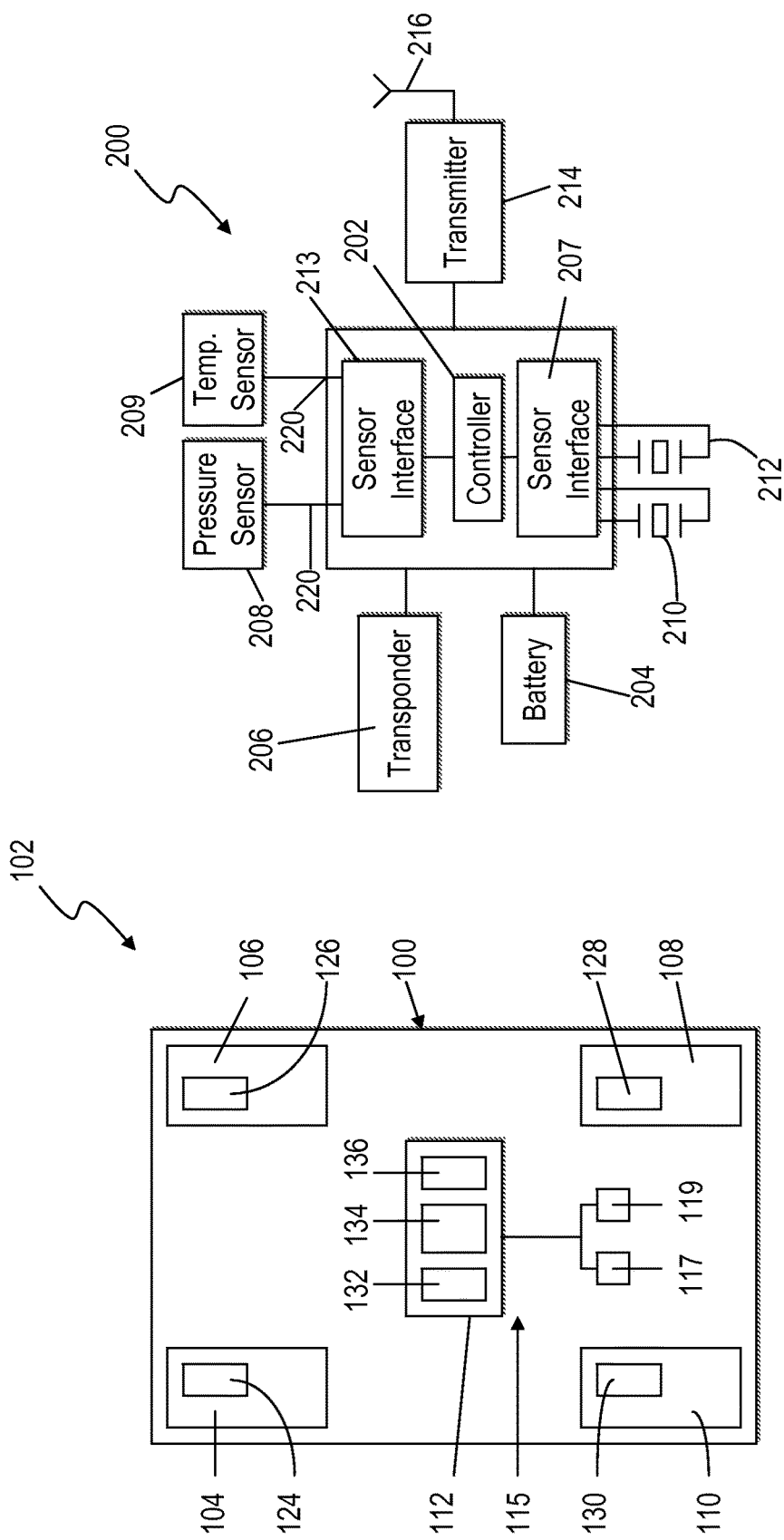

PULSE WIDTH MEASUREMENT METHOD AND APPARATUS

CROSS-REFERENCES

This application is a US National stage of pending application PCT/EP2014/051839, filed Jan. 30, 2014, entitled "PULSE WIDTH MEASUREMENT METHOD AND APPARATUS," which claims priority from pending Patent Application No. 1302046.6, filed Feb. 5, 2013, entitled "Pulse Width Measuring Method for Use in e.g. A Tyre Monitor" which are hereby incorporated by reference, as if set forth in full in this document, for all purposes.

FIELD OF THE INVENTION

The present invention relates to a pulse width measurement method and apparatus. The invention relates particularly, but not exclusively, to a method and apparatus for measuring pulse width in an output signal from a monitor mounted on a vehicle tyre.

BACKGROUND TO THE INVENTION

In a number of applications, it can be desirable to measure the width of a pulse in an electrical signal. For example, measurement of the pulse width of a train of pulses output from a tyre-mounted monitoring device can be used in the estimation of the size of the footprint of the tyre, which in turn can be used to estimate other characteristics of the tyre.

This may be achieved in the time domain by low-pass filtering the pulse signal in order to reduce noise, then measuring the time between two carefully selected reference points in the signal (e.g. the crossing of a specific threshold level). Unfortunately, in a poor signal-to-noise ratio condition, relatively heavy filtering is required to reduce the noise and this can affect the shape of the signal, thus changing its width. Also, depending on the shape of the pulse, the selection of the reference points can be difficult and not sufficiently general to suit every possible situation. The design of a suitable filter depends on width and rate of the pulses; if these change, then the filter should be adjusted accordingly and in real time in order to maintain the best noise reduction and limiting the pulse distortion. Finally, sharp filters introduce ripple in the signal which may trigger false detections.

It would be desirable to provide an improved pulse width measurement method and apparatus.

SUMMARY OF THE INVENTION

A first aspect of the invention provides an apparatus for measuring the width of a pulse in a target signal, the apparatus comprising:
  a frequency analyzer configured to produce a frequency representation of said pulse;
  a signal processor configured to determine a minimum value of said frequency representation of said pulse; and
  a pulse width estimator configured to invert said minimum value to produce a measurement for said pulse width.

Preferably, said minimum value is, or is derived from, a first minimum value detected in said frequency representation with respect to a datum frequency.

Advantageously, said signal processor is configured to calculate said minimum value by interpolation of a detected minimum frequency value with two or more other frequency values of said frequency representation.

A second aspect of the invention provides a method for measuring the width of a pulse in a target signal, the method comprising:
  producing a frequency representation of said pulse;
  determining a minimum value of said frequency representation of said pulse; and
  inverting said minimum value to produce a measurement for said pulse width.

A third aspect of the invention provides a tyre monitoring apparatus comprising a monitor installed on a tyre, said monitor generating in use a target signal, said tyre monitoring apparatus including an apparatus for measuring the width of a pulse in said target signal, the pulse width measuring apparatus comprising:
  a frequency analyzer configured to produce a frequency representation of said pulse;
  a signal processor configured to determine a minimum value of said frequency representation of said pulse; and
  a pulse width estimator configured to invert said minimum value to produce a measurement for said pulse width, wherein said tyre monitoring apparatus is configured to use said pulse width measurement as an indication of at least one characteristic of said tyre.

A fourth aspect of the invention provides a method for measuring the width of a pulse in a target signal generated by a monitor installed on a tyre, the method comprising:
  producing a frequency representation of said pulse;
  determining a minimum value of said frequency representation of said pulse;
  inverting said minimum value to produce a measurement for said pulse width; and
  using said pulse width measurement as an indication of at least one characteristic of said tyre.

In preferred embodiments, the frequency content of a pulse is analysed, which inherently does not require any pre-filtering (provided that the input signal is sampled correctly if processed numerically). This is because any additive noise present in the input signal is spread across the whole spectrum, and since only a limited range of frequencies are actually observed, this produces a very effective noise filter.

Preferred embodiments of the invention provide an estimate of the width of a pulse affected by noise which does not rely on pre-filtering of the target signal, thus preserving the original shape of the pulse.

Other preferred features are recited in the dependent claims.

Further advantageous aspects of the invention will become apparent to those ordinarily skilled in the art upon review of the following description of a specific embodiment and with reference to the accompanying drawings.

BRIEF DESCRIPTION OF THE DRAWINGS

An embodiment of the invention is now described by way of example and with reference to the accompanying drawings in which:

FIG. 1 is a block diagram of an embodiment of a tyre monitoring system shown in conjunction with parts of a vehicle;

FIG. 2 is a block diagram of a tyre monitoring apparatus included in the system of FIG. 1;

DETAILED DESCRIPTION OF THE DRAWINGS

Figure 3B:
FIGS. 3A and 3B are a schematic side view and schematic end view, respectively, of a tyre including an internally mounted tyre monitoring unit.

Referring now to FIG. 1 of the drawings, there is shown, generally indicated as 102, a tyre monitoring system shown in situ on a vehicle 100. For reasons of clarity, only those portions of the vehicle 100 and system 102 that are helpful in understanding the present invention are shown.

The vehicle 100 includes wheels 104, 106, 108, 110, each wheel including a tyre mounted on a rim. The system 102 includes a control unit 112 (such as a vehicle engine control unit (ECU), or a Body Control Module (BCM)) and tyre monitors 124, 126, 128, 130, typically generally referred to as sensors, transmitters, wheel units, or the like. The tyre monitors 124, 126, 128, 130 measure tyre characteristics and transmit corresponding tyre data for reception and processing by the control unit 112. Typically, a respective tyre monitor is associated with each wheel of the vehicle 100.

In typical embodiments, the tyre monitors are capable of measuring tyre pressure and of transmitting data to the control unit 112, including but not limited to data representing the measured tyre pressure and usually also identification information uniquely identifying the respective tyre monitor. Each of the tyre monitors 124, 126, 128, 130 includes a suitably powered wireless transmitter, conveniently a battery (or otherwise) powered radio frequency (RF) transmitter, and typically a pressure sensor for measuring the pressure of the gas (usually air) within the tyre. In such embodiments, the system 102 may be referred to as a tyre pressure monitoring system (TPMS).

Any suitable control unit may be used in the system 102. By way of example, in the illustrated embodiment, the control unit 112 includes a controller 132 (e.g. the vehicle ECU), a memory device 134 and a receiver 136 for receiving wireless transmissions from the tyre monitors.

Referring now to FIG. 2, there is shown a block diagram of an embodiment of a tyre monitor 200. The tyre monitor 200 includes a controller 202, a power source such as a battery 204, one or more sensors (in this example a pressure sensor 208 and one or more piezoelectric motion sensors 210, 212), a wireless transmitter 214 and an antenna 216. The monitor 200 typically also includes a transponder coil 206. It will be apparent that the monitor 200 may use any convenient power source instead of or as well as a battery, e.g. thermoelectric and/or piezoelectric generators and/or electromagnetic induction. The tyre monitor 200 typically also includes a temperature sensor for measuring the temperature of the tyre and/or of the gas within the tyre. In this illustration, the motion sensors 210, 212 each comprise a respective shock sensor of the type that produces an electrical signal in response to being subjected to acceleration (a shock sensor may be responsive acceleration magnitude and/or to changes in acceleration, the electrical signal being indicative of, typically proportional to, the experienced acceleration, change in acceleration, and/or the rate of change of acceleration). Alternatively, the sensors 210, 212 may each comprise an alternative type of sensor e.g. acceleration sensor, accelerometric device, accelerometer, force sensor or a microelectromechanical systems (MEMs) sensor, that similarly is responsive acceleration magnitude and/or to changes in acceleration. Shock sensors may be referred to generically as piezoelectric rotation sensors. In alternative embodiments, other types of piezoelectric rotation sensors, or other types of motion sensor, force sensor, displacement sensor or rotation sensor may be used in place of the shock sensors described herein.

In the illustrated embodiment, the pressure sensor 208 detects the pneumatic air pressure of the tyre with which the tyre monitor 200 is associated. The temperature sensor 209 measures the temperature of the tyre and/or of the air within the tyre. In alternative embodiments, the pressure sensor 208 may be supplemented with or replaced by other devices for detecting tyre data, or omitted.

A sensor interface, in this case a shock sensor interface 207, is provided in the tyre monitor 200 and is configured to provide the necessary control signals and detect the electrical signals from the shock sensors 210, 212. The shock sensors 210, 212 in one embodiment are responsive to acceleration to produce an output in the form of an electrical charge output signal. The output signal is typically in the order of 1 mV/g. The shock sensor interface 207 receives the electrical output signal, which is analogue in nature, amplifies and filters the signal to provide a corresponding processed output signal to the controller 202. The shock sensor interface 207 operates in response to control signals from the controller 202. Preferably, shock sensors 210, 212 can share the same interface 207 via multiplexing.

During use, the controller 202 is able to determine at least one characteristic of the tyre, based on electrical signals produced by one or both of the shock sensors 210, 212 as the wheel rotates. For example, the shock sensor outputs can be used to determine whether the tyre is on the left side or the right side of the vehicle, and/or whether or not the tyre is rolling. The controller 202 may be implemented by any suitable means, for example a microprocessor, microcontroller or other suitable data processing device programmed to perform the functions described herein.

Figure 3A:
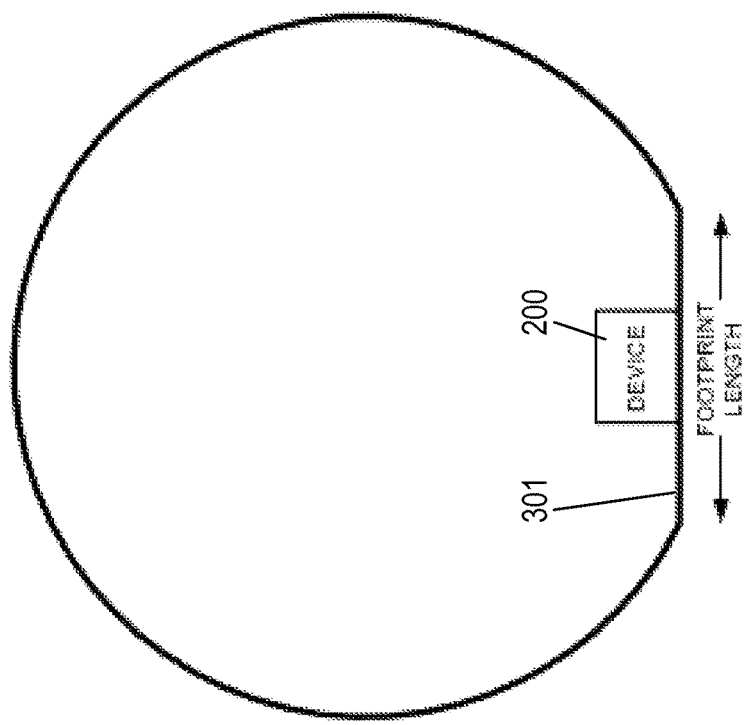

FIG. 3 shows part of a tyre 301 having a tyre monitoring unit 200 mounted therein. Typically the unit 200 is mounted on, or otherwise coupled to, an internal surface of the tyre 301, especially on the inside of the tread rather than the side wall, by any convenient means. Tyre monitoring units of this type are commonly referred to as a tyre mounted sensor (TMS). As the tyre 301 rotates, the portion that engages with the road surface at any given time is flattened. The flattened portion is known as the tyre's footprint. One or more characteristics, e.g. the size, in particular the length, of the footprint (typically measured in the direction of travel of the vehicle), may be used for example as an indication of the load on the tyre. The electrical signal(s) produced by either or both of the sensors 210, 212 can be used to measure the footprint, in particular its length, as is now described in more detail. It will be understood that, while the illustrated embodiment includes two sensors 210, 212, alternative embodiments of the invention may have only one sensor, or more than two, for providing one or more target signals in respect of which pulse width measuring is performed.

Figure 5A:
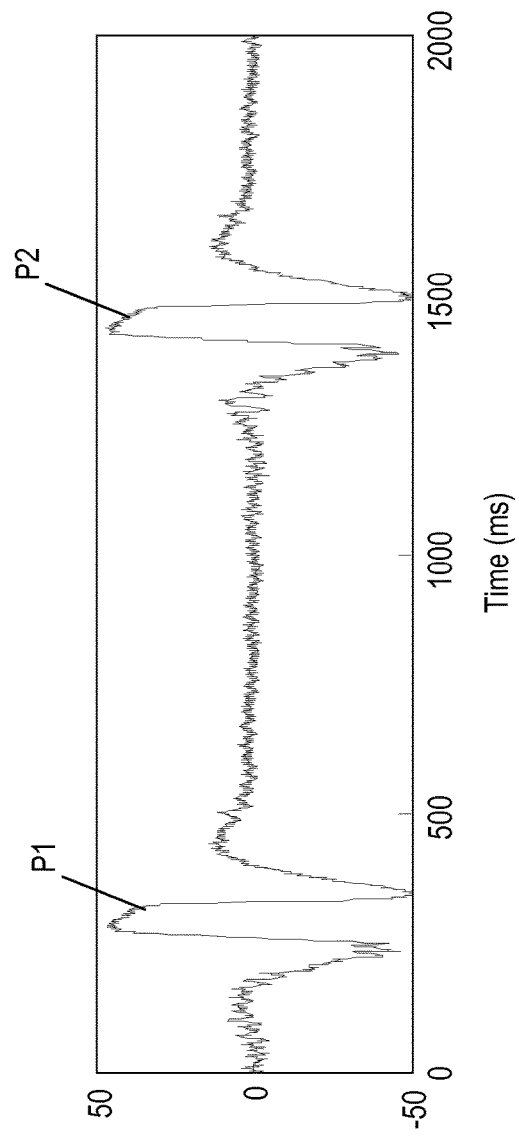
FIG. 5A is a graph showing an example of an output signal from a tyre monitor shown in the time domain.
Figure 5B:
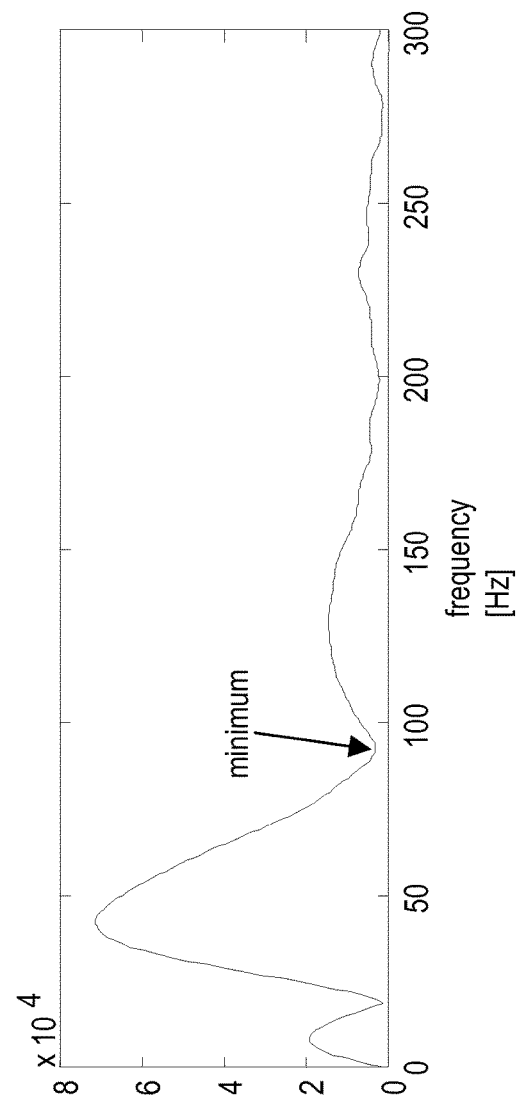
FIG. 5B is a graph showing a frequency analysis of the output signal of FIG. 5A.

When the vehicle is travelling, the electrical output signal produced by the, or each, sensor 210, 212 comprises a train of pulses, each pulse corresponding to a respective instance when the portion of the tyre that carries the monitor 200 (and more particularly the sensors 210, 212) strikes the road or other surface along which the vehicle is travelling. FIG. 5A shows an example of the signal produced by one or both of the sensors 210, 212 in the time domain. The signal of FIG. 5A is a sampled signal, without interpolation, and shows two pulses P1, P2. The width of these pulses, which is typically measured in time, is an indication of the length of the tyre's footprint.

In preferred embodiments of the invention, a measure of the width of a pulse in a target signal (e.g. the output signal from any one of the sensors 210, 212, or other target signal producing sensor) is obtained by, starting from a datum frequency value, detecting a first minimum frequency value (which may be a null value) in a frequency domain representation of the pulse. The inverse of the frequency value where the minimum value occurs provides the measure of the pulse width. In case of rectangular pulses this corresponds to the exact width, the measure always being insensitive to the pulse amplitude and proportional to the pulse width. The datum frequency value may be selected to suit the application, and may be zero or higher. For example, for a typical tyre mounted sensor (TMS), the datum frequency may be approximately 40 Hz. More generally, the datum frequency may be the lowest frequency expected to be present in the frequency representation of the target signal, and in particular in respect of a pulse of the target signal.

Figure 4A:
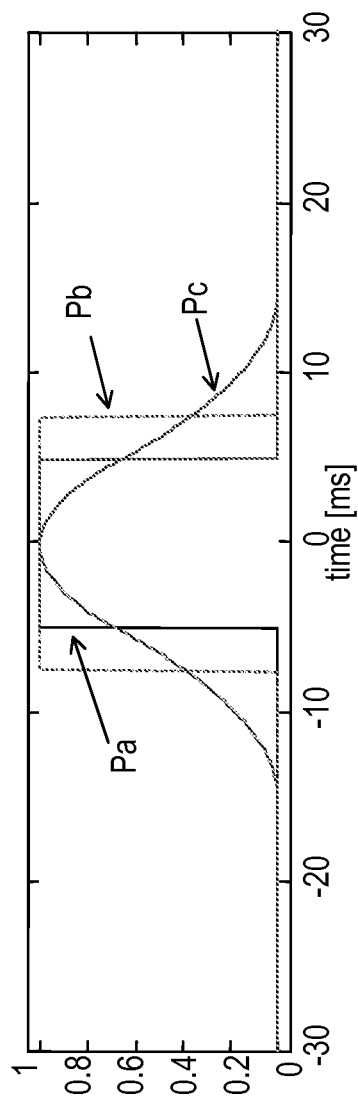
FIG. 4A is a graph showing three sample pulse signals in the time domain.
Figure 4B:
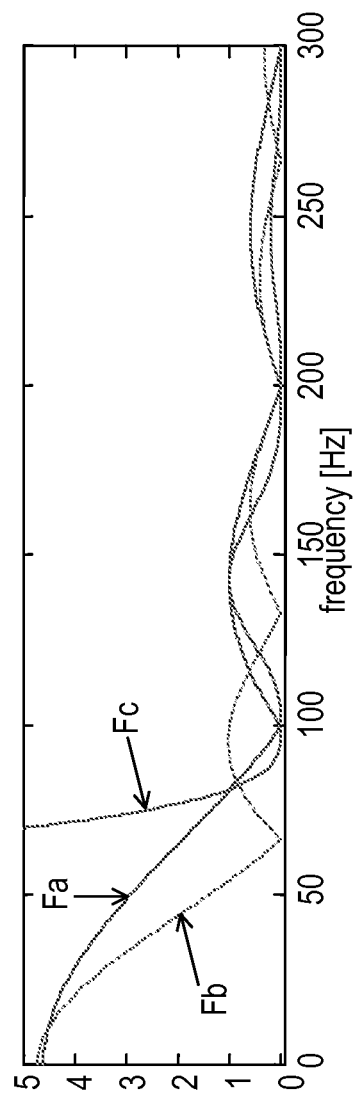
FIG. 4B is a graph illustrating a respective frequency analysis of the respective pulse signals of FIG. 4A.

Referring now to FIGS. 4A and 4B, there is shown, respectively, a graph showing three sample pulse signals Pa, Pb, Pc in the time domain, and a graph illustrating corresponding respective frequency representations Fa, Fb, Fc of the respective pulse signals Pa, Pb, Pc. Each pulse Pa, Pb, Pc is centred around time=0. Pulses Pa and Pb are rectangular pulses, Pb being 50% wider than pulse Pa. Pulse Pc is a parabolic pulse.

As can be seen from FIG. 4B, the frequency signal produced by any suitable transform, e.g. a frequency transform (a Fourier transform in this example) of a single rectangular time domain pulse of duration T comprises a cardinal sine signal, whose first zero, or minimum, occurs at frequency $f_{min}=1/T$. In practice, a signal is typically only roughly approximated by rectangular pulses. However, its frequency spectrum may still be characterised by a minimum at frequency $f_{min}$ whose inverse value provides a measure of the pulse width.

The frequency spectrum of the time domain signal (which is typically sampled before transformation) can be obtained by any convenient frequency, or other, transform means for performing frequency analysis, for example a Discrete Fourier Transform (DFT), e.g. a Fast discrete Fourier Transform (FFT). Frequency analysis can also be obtained using a bank of (digital or analogue) band-pass filters (e.g. configured to implement the Goertzel algorithm). Using a filter bank as the frequency transform means is advantageous in that it does not require storage of the signal and updates the result as each sample becomes available, thus spreading the computation time (as opposed to the FFT which can only be applied to a block of samples). This has the advantage of reducing the latency of the output and in most cases leads to a more efficient algorithm. If required, the filter bank can alternatively be implemented using an analogue circuit.

In order to compute $f_{min}$, a straightforward approach is to isolate a single impulse from the target signal, sample it and perform an N-point FFT (or other suitable transform) on the signal samples. This approach has a number of disadvantages for some applications, such as the memory requirements (the FFT works on a block of samples). Also, computational efficiency can only be achieved by computing the entire spectrum (or at least the spectrum up to the Nyquist frequency $f_s/2$), while the portion of spectrum required for the present analysis may be much smaller. The number of samples N should also be a power of 2 in order to fully exploit the properties of the FFT.

An alternative option is to use a bank of relatively narrow band-pass (or pin) filters. The filter bank may for example be configured to implement the Goertzel algorithm, which employs a $2^{nd}$ order IIR filter for each frequency of interest, or each point in the spectrum. The number of filters in the filter bank may be selected to suit the application and/or the required accuracy of the frequency analysis. Typically, it depends on the minimum and maximum expected frequency values in the frequency representation. The resolution or spacing between the respective bands of the filters may be selected to produce the desired accuracy. Preferably the frequency spacing between filters is $2^n$, where n is a positive integer. The action of each filter is equivalent to computing a 'frequency bin' of DFT (e.g. FFT or other suitable transform), although computing all the bins of the DFT with the Goertzel algorithm would be much more expensive than using an FFT algorithm. An advantage however is that frequencies can be set anywhere in the spectrum (as opposed to regular intervals $f_s/N$ in the DFT) and in any number. Also, the implemented algorithm is updated at every sample, without the need for memory buffers to store inputs and outputs (although a number of memory locations are required for the filter implementation).

Figure 6:
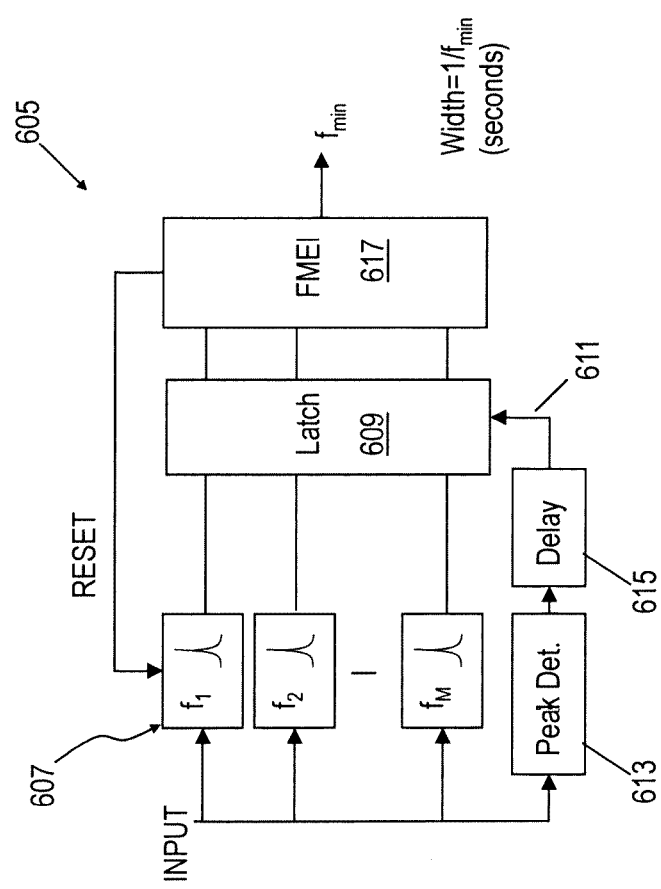
FIG. 6 is a block diagram of a signal processing apparatus for determining a minimum frequency of a pulse, suitable for use with embodiments of the invention.

FIG. 6 is a block diagram of a signal processing apparatus 605 for performing frequency analysis on the target signal (INPUT) and determining a minimum frequency of a pulse. The apparatus 605 includes a frequency analyzer in the preferred form of a bank of filters 607, which may be implemented in any convenient manner (e.g. by computer software). The (respective) frequency spectrum representing the, or each, pulse is obtained by passing the target signal through each filter 607. In embodiments where the filters are digital then the input signal is sampled before being provided to the filters, but in embodiments where the filters are analogue then the input signal does not need to be sampled first.

In typical applications where the target signal comprises a train of spaced-apart pulses, once a pulse has passed through the filters 607, the respective output of the filters will remain approximately constant until the next pulse arrives, as there is no significant energy in the target signal between pulses (as can be seen from FIG. 5A for example). Therefore, at any time before the arrival of the next pulse, the output of the filters 607 may be taken as an approximation of the desired frequency spectrum of the pulse. Conveniently, the respective outputs of the filters 607 can be captured by a latch device 609. The latch 609 may be activated by a trigger signal at input 611. The trigger signal may for example be obtained from the output of a pulse detector, which may conveniently comprise a peak detector 613, the peak detector 613 being provided with the target signal and being operable to detect the presence of each pulse and to generate the trigger signal upon detection of each pulse. The peak detector 613 is optionally followed by a delay element 615 configured to introduce a delay in the trigger signal that is long enough to ensure that the pulse is passed through the filters 607 before the filter outputs are read. It will be understood that the peak detector 613 and delay element 615 are not essential; in particular an accurate detection of peaks in the target signal is not necessary and the only requirement for the delay is that it must be smaller than the minimum expected time between pulses. It can optionally be adjusted according to the current pulse rate (time between pulses).

An alternative method of triggering the computation of the frequency spectrum (i.e. an alternative to using a delay element as described above) is to monitor the power of the input signal, or the energy of a plurality of most recent input samples, and to generate a trigger signal whenever the measured power or energy becomes smaller than a threshold value. This helps to ensure that the pulse has been acquired completely. This technique does not require knowledge of the pulse rate or any other characteristic of the signal. The signal processing apparatus 605 may be provided with any suitable conventional means for performing this method.

As successive pulses arrive, the resulting frequency spectrum starts to show frequency peaks at multiples of 1/T, where T is the pulse width measured in time. This can prevent the correct identification of $f_{min}$, especially when a small number of filters are used. It is thus preferred to reset the filters 607 (e.g. set all its memory cells to a null value in the case of a digital filter) after the frequency spectrum has been acquired. This operation is represented in FIG. 6 by a RESET signal.

The apparatus 605 includes a signal processor 617 configured to detect the first null, or minimum, in the captured frequency spectrum (produced by the outputs of filters 607 and captured by the latch device 609 in this example). Conveniently, the module 617 may generate the RESET signal.

The apparatus 605 includes or is co-operable with a pulse width estimator (not shown) which determines a value for the pulse width from the detected minimum frequency value, i.e. by inversion of the minimum frequency value.

A similar procedure, and therefore similar signal processing apparatus, can be followed when an FFT is used in place of the filter bank. In this case the frequency spectrum may computed by a frequency transformer (not illustrated but typically implemented in software) which stores the last N samples of the target signal in any convenient storage device (not shown) and performs the FFT on the N samples, preferably after ensuring that the pulse has been captured completely within those N values. This may be achieved by providing a First-In First-Out (FIFO) memory for storing the last N samples, while the peak detector triggers the start of the FFT of the N stored samples. The number of samples N should be high enough to be able to capture the widest expected pulse, but also not too high in order to avoid capturing more than one pulse at a time.

In order to optimize the number of filters 607 (or frequency bins of the FFT) while maintaining relatively good precision, determination of the minimum frequency value can be improved through interpolation, conveniently quadratic interpolation, of values in the frequency representation. This may be computed using the detected minimum frequency value along with one or more frequency values on each side (higher and lower in value) of the detected minimum value, preferably comprising the next adjacent higher value and the next adjacent lower value. Any suitable conventional interpolation algorithm may be used. For quadratic interpolation, the detected minimum value can be used together with the closest higher and closest lower frequency values in the frequency representation. Any convenient conventional means may be used to detect the minimum frequency value from the values of the frequency representation.

In FIG. 6, the signal processing module 617 is assumed to perform interpolation and may be referred to as a first minimum extraction and interpolation (FMEI) module.

Optionally, the signal processing apparatus 605 includes a pre-processing module (not shown) for windowing the input signal prior to its transformation to the frequency domain. This is particularly advantageous in cases where the input signal includes a relatively high amount of signal noise, which can sometimes hinder the correct detection of the minimum frequency value. Pre-windowing the input signal before transformation into the frequency domain may be implemented by any suitable conventional means. For example, whenever a fixed number of samples N are used to compute the frequency spectrum, the windowing operation may comprise a sample-by-sample multiplication of the input data by a fixed window function (e.g. triangular, raised cosine), which may also be stored in a table of N values.

By way of example, in the context of tyre footprint measurement, the apparatus 605 may be implemented by the controller 202 and/or the control unit 112, using hardware and/or software as convenient.

Figure 7:
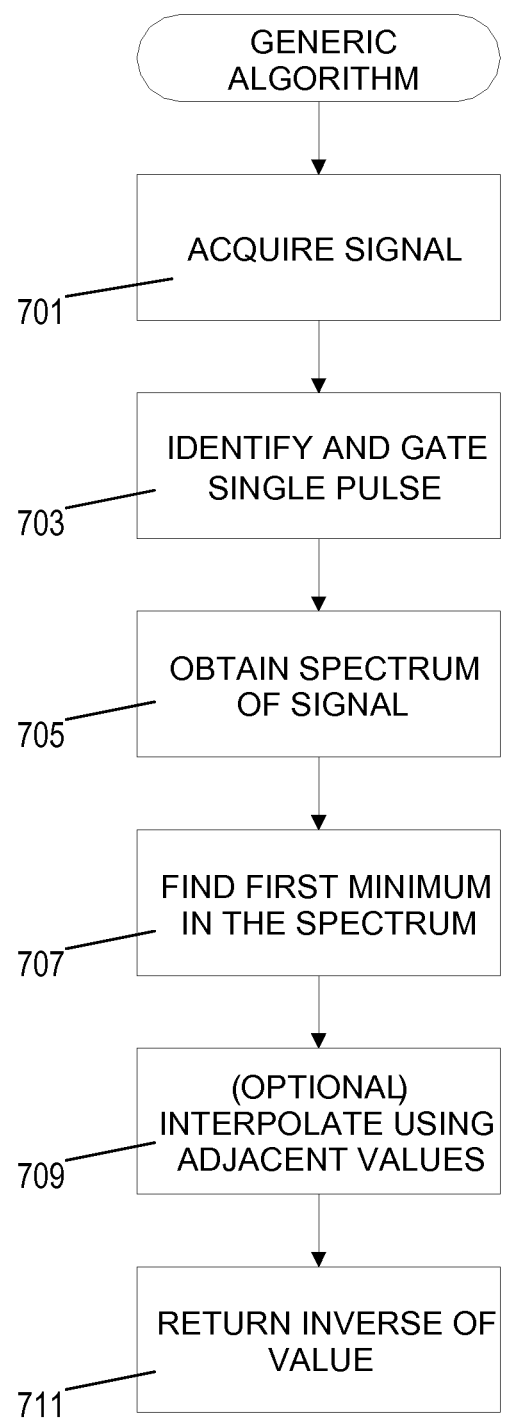
FIG. 7 is a flow chart illustrating a generic method of measuring pulse width, embodying one aspect of the invention.

FIG. 7 shows a flow chart illustrating a high level method for determining pulse width. At step 701, the target signal is acquired. This may be achieved by any convenient means as suits the application. For example, in the case of tyre footprint measurement, the target signal may be acquired by the controller 202 from the sensor interface 207.

At step 703, a single pulse from the target signal is identified and, if necessary, gated or otherwise isolated or captured to enable analysis. Identifying pulses can be performed by any convenient conventional means, for example, peak detection, filtering or using other signal processing techniques. If necessary, data representing the pulse may be stored, e.g. as part of the pulse isolation process.

At step 705, a frequency spectrum representing the pulse is obtained. This may be achieved by any convenient conventional frequency analysis means, e.g. filter bank analysis or the application of a frequency transform such as the FFT or DFT.

At step 707, the first minimum value of the frequency spectrum is identified. This may be achieved using any convenient conventional signal processing technique.

At step 709, interpolation is optionally performed using adjacent values.

At step 711, the inverse ($1/f_{min}$) of the minimum frequency valve is calculated. The inverse value is taken as a measure of the width of the pulse. In the tyre monitoring embodiment, the pulse width measurement is taken as a measure of the size, in particular the length, of the tyre footprint.

Figure 8:
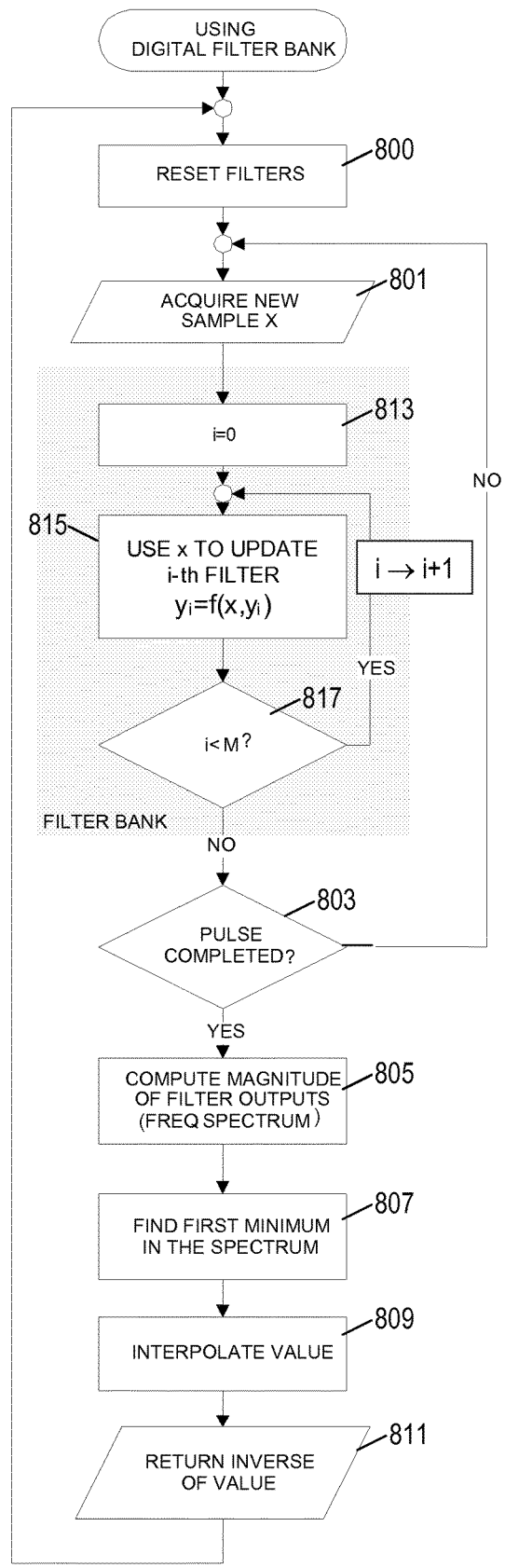
FIG. 8 is a flow chart illustrating a specific embodiment of the method of FIG. 7, wherein a filter bank is used to perform frequency analysis of the target signal.

FIG. 8 shows a flow chart illustrating a specific method for determining pulse width in which a filter bank is used to perform frequency analysis. The method of FIG. 8 is similar to that of FIG. 7 (particularly in relation to steps 801, 803, 805, 807, 809 and 811) and so like numerals are used to indicate like parts and the same description applies as would be apparent to a skilled person. In this example it is assumed that the filter bank comprises M filters. In step 800, the filter output values are reset.

In step 801, a sample x of the target signal is acquired. In steps 813, 815 and 817, the sample is applied to the filter bank, each filter performing a filter function $y_i=f(x, y_i)$, where i is an filter index. In step 813 the index i is initialised (set to zero in this example). In step 815, the sample x is applied to the ith filter and the value of i is incremented. In step 817, a check is made to determine if the sample x has been applied to all M filters. If not, then steps 815 and 817 are repeated. Otherwise step 803 is implemented.

In step 803, a determination is made as to whether a pulse is detected, and in particular as to whether a detected pulse has completed. In this example, this is achieved by detecting a peak in the target signal, and more particularly by detecting the completion of the peak. If a completed pulse has not been detected, then a new sample is acquired, i.e. a return to step 801. If a completed pulse has been detected, then step 805 is implemented. In step 805 the respective outputs of the M filters are taken as the frequency representation of the detected pulse. The output of the filter comprises an array of M values produced in response to the samples that have been filtered since the last reset. The filter output typically comprises an actual spectrum (e.g. expressed as complex numbers), and the magnitude of each frequency bin is computed accordingly before the next step.

Figure 9:
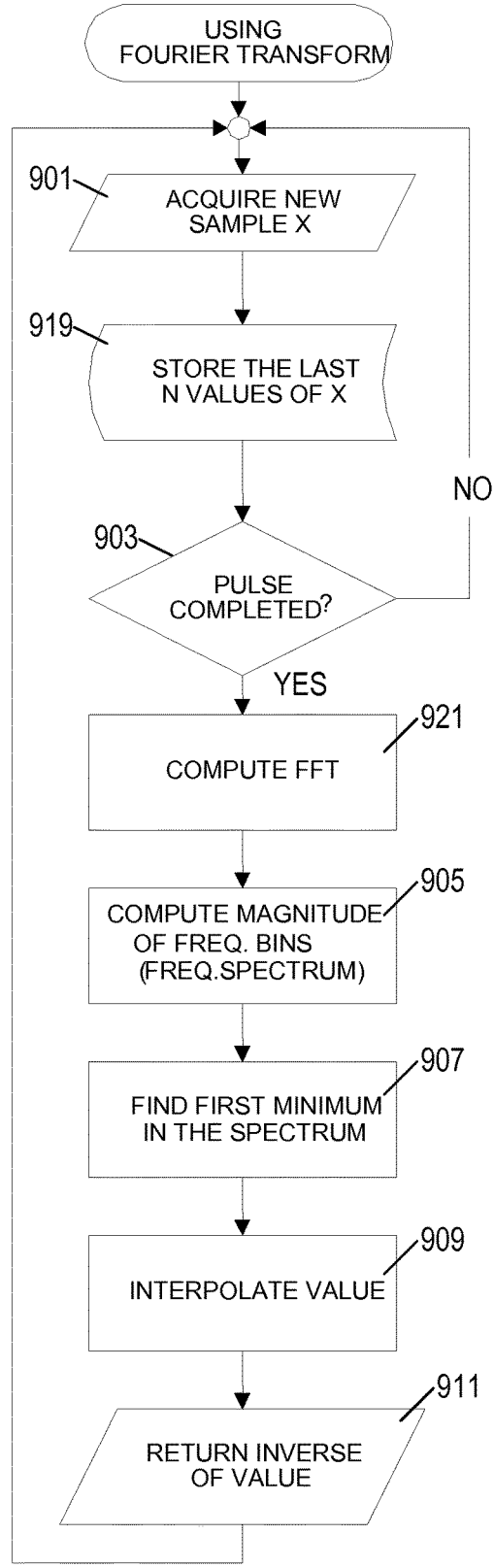
FIG. 9 is a flow chart illustrating an alternative embodiment of the method of FIG. 7, wherein a fast fourier transform (FFT) is used to perform frequency analysis of the target signal.

FIG. 9 shows a flow chart illustrating an alternative specific method for determining pulse width in which an FFT is used to perform frequency analysis.

The method of FIG. 9 is similar to that of FIG. 7 (particularly in relation to steps 901, 903, 905, 907, 909 and 911) and so like numerals are used to indicate like parts and the same description applies as would be apparent to a skilled person. In step 919, N values from the sample x are stored for use in the FFT computation (assuming an N-point FFT computation). In step 903, a determination is made as to whether a pulse is detected. In this example, this is achieved by detecting a completed pulse in the target signal. If a completed pulse has not been detected, then a new sample is acquired, i.e. a return to step 901. If a completed pulse has been detected, then step 921 is implemented. In step 921, an N point FFT is computed. In step 905 the frequency spectrum representing the pulse is derived from the FFT results.

In the example application where road strike duration in a tyre is being measured in order to estimate the tyre's contact patch (footprint), a shock sensor, or other sensor, is placed on an inside surface of the tyre, e.g. on the inner liner of the tyre, so that it will generate an electrical pulse each time that point of the tyre touches the road surface. FIG. 5A shows a typical signal acquired by such a sensor. The frequency spectrum of the sensor output signal remains substantially unchanged between pulses, despite the presence of noise.

It will be understood that embodiments of the invention are not limited to use with analysing signals from tyre monitors. Embodiments of the invention may alternatively be used in the analysis of pulse signals from other sources, for example a heart monitor, especially where it is desired to measure the width or duration of one or more pulses in a signal, typically an electrical signal, comprising a single pulse or a train of spaced-apart pulses.

Preferred embodiments of the invention exhibit any one or more of the following features: estimation of pulse width by detecting a minimum value in a frequency domain representation of the pulse; use of a bank of filters to compute the frequency spectrum in real time; use of quadratic interpolation to increase the precision or to reduce the number of filters.

Preferred embodiments of the invention provide one or more of the following advantages: time-variant filters are not required; the method is insensitive to the amplitude of the target signal; no high resolution in time is required, which allows lower sampling frequencies; the measure obtained is univocal and does not require any further definition (e.g. points in the signal where the measure is taken); in particular the measure reflects the properties of the pulse as a whole, and therefore is less subject to noise or local distortions of the signal; readily susceptible to implementation in an ASIC (without complex DSP blocks).

In typical embodiments, an aim is to minimize computational and storage resources. This allows relatively simple and cost-effective implementation on an ASIC. Moreover, since the measuring apparatus may be powered by a relatively small battery, energy consumption should also be optimised. The use of a bank of Goertzel filters together with the use of a simple interpolation (as opposed for example to an FFT computed over a finely sampled input signal) requires a smaller number of operations and fewer storage requirements. As a consequence, a smaller data throughput also means smaller energy consumption (e.g. slower clock frequency and/or less dedicated hardware). The computational cost can be further reduced by switching off all or part of some or all of the filters, whenever a rough estimation of the pulse width (i.e. a range of frequency where to expect the sought minimum) is available.

The invention is not limited to the embodiment described herein, which may be modified or varied without departing from the scope of the invention.

The invention claimed is:

1. An apparatus for measuring the width of a pulse in a target signal, the apparatus comprising:
   a frequency analyzer configured to produce a frequency representation of said pulse, wherein said pulse is generated by a tire mounted sensor (TMS) mounted on a vehicle tire;
   a signal processor configured to determine a minimum value of said frequency representation of said pulse; and
   a pulse width estimator configured to invert said minimum value to produce a measurement for said pulse width, said measurement for said pulse width indicative of a footprint of the vehicle tire.

2. An apparatus as claimed in claim 1, wherein said minimum value is, or is derived from, a first minimum value detected in said frequency representation with respect to a datum frequency.

3. An apparatus as claimed in claim 1, wherein said signal processor is configured to calculate said minimum value by interpolation of a detected minimum frequency value with two or more other frequency values of said frequency representation.

4. An apparatus as claimed in claim 3, wherein said two or more other frequency values comprise the next adjacent lower frequency value and the next adjacent higher frequency value in said frequency representation.

5. An apparatus as claimed in claim 1, further including a pulse detector configured to detect pulses in said target signal.

6. An apparatus as claimed in claim 5, wherein said pulse detector comprises a peak detector.

7. An apparatus as claimed in claim 5, wherein said frequency analyzer is configured to produce said frequency representation in response to detection of said pulse, preferably the completion of said pulse, by said pulse detector.

8. An apparatus as claimed in claim 7, wherein said target signal is provided to said frequency analyzer, said frequency analyzer being configured to produce said frequency representation from a portion of said target signal identified in use by said pulse detector as said pulse.

9. An apparatus as claimed in claim 1, wherein said frequency analyzer comprises a frequency analysis filter bank.

10. An apparatus as claimed in claim 9, wherein said filter bank comprises a plurality of filters, preferably Goertzel filters, each filter being configured to pass target signal components in a respective frequency band.

11. An apparatus as claimed in claim 1, wherein said frequency analyzer comprises a frequency transformer configured to perform at least one frequency transform on at least part of said target signal.

12. An apparatus as claimed in claim 11 further including a pulse detector configured to detect pulses in said target signal and wherein said frequency transformer is operable to perform said at least one frequency transform on a portion of said target signal identified in use by said pulse detector as said pulse.

13. An apparatus as claimed in claim 11, wherein said at least one frequency transform comprises a Fast Fourier Transform (FFT).

14. An apparatus as claimed in claim 11, wherein said at least one frequency transform comprises a Discrete Fourier Transform (DFT).

15. An apparatus as claimed in claim 7, wherein said frequency analyzer is operable to generate said frequency representation after a delay has elapsed since the detection of said pulse by said pulse detector.

16. An apparatus as claimed in claim 15, wherein said delay is less than an expected minimum delay between successive pulses, and preferably more than an expected minimum pulse duration.

17. An apparatus as claimed in claim 15, further including a delay device, wherein said frequency analyzer is co-operable with said delay device for creating said delay.

18. An apparatus as claimed in claim 17, wherein said pulse detector is configured to produce an activation signal for said frequency analyzer, said delay device being configured to delay said activation signal.

19. An apparatus as claimed in claim 1, further including a latch device, said latch device being operable to store a portion of said target signal, said frequency analyzer being configured to produce said frequency representation from said portion stored by said latch device.

20. An apparatus as claimed in claim 19 further including a pulse detector configured to detect pulses in said target signal and wherein said latch device is operable to store said portion in response to detection of said pulse by said pulse detector.

21. An apparatus as claimed in claim 20 wherein said frequency analyzer is operable to generate said frequency representation after a delay has elapsed since the detection of said pulse by said pulse detector and wherein said latch device is operable to store said portion after said delay has elapsed since detection of said pulse by said pulse detector.

22. An apparatus as claimed in claim 1, included in a tire monitoring apparatus, said target signal being generated in use by a monitor installed on said tire, and wherein said apparatus is configured to use said pulse width measurement as an indication of at least one characteristic of said tire.

23. An apparatus as claimed in claim 22, wherein said monitor includes said TMS that is responsive to engagement of a part of said tire with a road surface to generate said pulse in said target signal.

24. An apparatus as claimed in claim 23, wherein said monitor is mounted on an inner liner of said tire, inside the tire.

25. An apparatus as claimed in claim 23, wherein said TMS comprises a shock sensor, accelerometer or force sensor.

26. An apparatus as claimed in claim 22, wherein said at least one characteristic of said tire comprises the size of said footprint made by said tire on a road surface.

27. An apparatus as claimed in claim 26, wherein said at least one characteristic of said tire comprises the length of said footprint.

28. An apparatus as claimed in claim 1, further including a storage device, said storage device being operable to store a portion of said target signal, said frequency analyzer being configured to produce said frequency representation from said portion stored by said storage device.

29. An apparatus as claimed in claim 1, further including monitoring means for monitoring the power of the target signal, or the energy of a plurality of samples of the target signals, and to generate a trigger signal whenever the measured power or energy is less than a threshold value, said frequency analyzer being responsive to said trigger signal to produce said frequency representation.

30. An apparatus as claimed in claim 9, wherein said frequency analyzer is configured to disable at least part of said filter bank after said frequency representation of said pulse is produced but before said signal processor determines said minimum value of said frequency representation of said pulse.

31. A method for measuring the width of a pulse in a target signal, the method comprising:
  producing a frequency representation of said pulse, wherein said pulse is generated by a tire mounted sensor (TMS) mounted on a vehicle tire;
  determining a minimum value of said frequency representation of said pulse; and
  inverting said minimum value to produce a measurement for said pulse width, said measurement for said pulse width indicative of a footprint of the vehicle tire.

32. A tire monitoring apparatus comprising a monitor installed on a tire, said monitor generating in use a target signal, said tire monitoring apparatus including an apparatus for measuring the width of a pulse in said target signal, the pulse width measuring apparatus comprising:
  a frequency analyzer configured to produce a frequency representation of said pulse;
  a signal processor configured to determine a minimum value of said frequency representation of said pulse; and
  a pulse width estimator configured to invert said minimum value to produce a measurement for said pulse width, wherein said tire monitoring apparatus uses said pulse width measurement to determine at least one characteristic of said tire.

33. A method for measuring the width of a pulse in a target signal generated by a monitor installed on a tire, the method comprising:
  producing a frequency representation of said pulse;
  determining a minimum value of said frequency representation of said pulse;
  inverting said minimum value to produce a measurement for said pulse width; and using said pulse width measurement to determine at least one characteristic of said tire.

34. A method as claimed in claim 31, including using said pulse width measurement as an indication of the size of a footprint made by said tire on a road surface.

\* \* \* \* \*